US011693784B2

(12) United States Patent
Mendes et al.

(10) Patent No.: US 11,693,784 B2
(45) Date of Patent: *Jul. 4, 2023

(54) ELASTIC BUFFER IN A MEMORY SUB-SYSTEM FOR DEBUGGING INFORMATION

(71) Applicant: Micron Technology, Inc., Boise, ID (US)

(72) Inventors: Joe Mendes, Santa Cruz, CA (US); Chandra Guda, Fremont, CA (US); Steven Gaskill, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,857

(22) Filed: Mar. 8, 2022

(65) Prior Publication Data

US 2022/0188240 A1    Jun. 16, 2022

Related U.S. Application Data

(63) Continuation of application No. 16/719,765, filed on Dec. 18, 2019, now Pat. No. 11,301,390.

(51) Int. Cl.
| G06F 12/0893 | (2016.01) |
| G06F 13/16 | (2006.01) |
| G11C 29/04 | (2006.01) |
| G06F 11/07 | (2006.01) |
| G06F 11/30 | (2006.01) |

(52) U.S. Cl.
CPC ...... *G06F 12/0893* (2013.01); *G06F 13/1673* (2013.01); *G06F 2212/608* (2013.01)

(58) Field of Classification Search
CPC ............ G06F 12/0893; G06F 13/1673; G06F 2212/608
USPC ........................................................ 711/118
See application file for complete search history.

(56) References Cited

U.S. PATENT DOCUMENTS

| 6,760,324 | B1* | 7/2004 | Scott ....................... H04L 45/42 370/352 |
| 11,301,390 | B2* | 4/2022 | Mendes ............... G06F 11/3037 |
| 2005/0198273 | A1* | 9/2005 | Childress ................ H04L 67/63 709/224 |
| 2009/0089559 | A1 | 4/2009 | Wang et al. |
| 2016/0306675 | A1 | 10/2016 | Wiggers |
| 2019/0179694 | A1 | 6/2019 | Park |
| 2019/0259465 | A1 | 8/2019 | Subramanian et al. |
| 2020/0341868 | A1* | 10/2020 | Carpenter ........... G06F 11/0709 |

* cited by examiner

*Primary Examiner* — Edward J Dudek, Jr.
*Assistant Examiner* — Sidney Li
(74) *Attorney, Agent, or Firm* — Lowenstein Sandler LLP

(57) ABSTRACT

A processing device in a memory system determines to send system state information associated with the memory device to a host system and identifies a subset of a plurality of event entries from a staging buffer based on one or more filtering factors, the plurality of event entries corresponding to events associated with the memory device. The processing device further sends the subset of the plurality of event entries as the system state information to the host system over a communication pipe having limited bandwidth.

20 Claims, 6 Drawing Sheets

ELASTIC BUFFER IN A MEMORY SUB-SYSTEM FOR DEBUGGING INFORMATION

RELATED APPLICATIONS

This application is a continuation of U.S. patent application Ser. No. 16/719,765, filed Dec. 18, 2019, the entire contents of which are hereby incorporated by reference herein.

TECHNICAL FIELD

Embodiments of the disclosure relate generally to memory sub-systems, and more specifically, relate to an elastic buffer in a memory sub-system for debugging memory device information.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
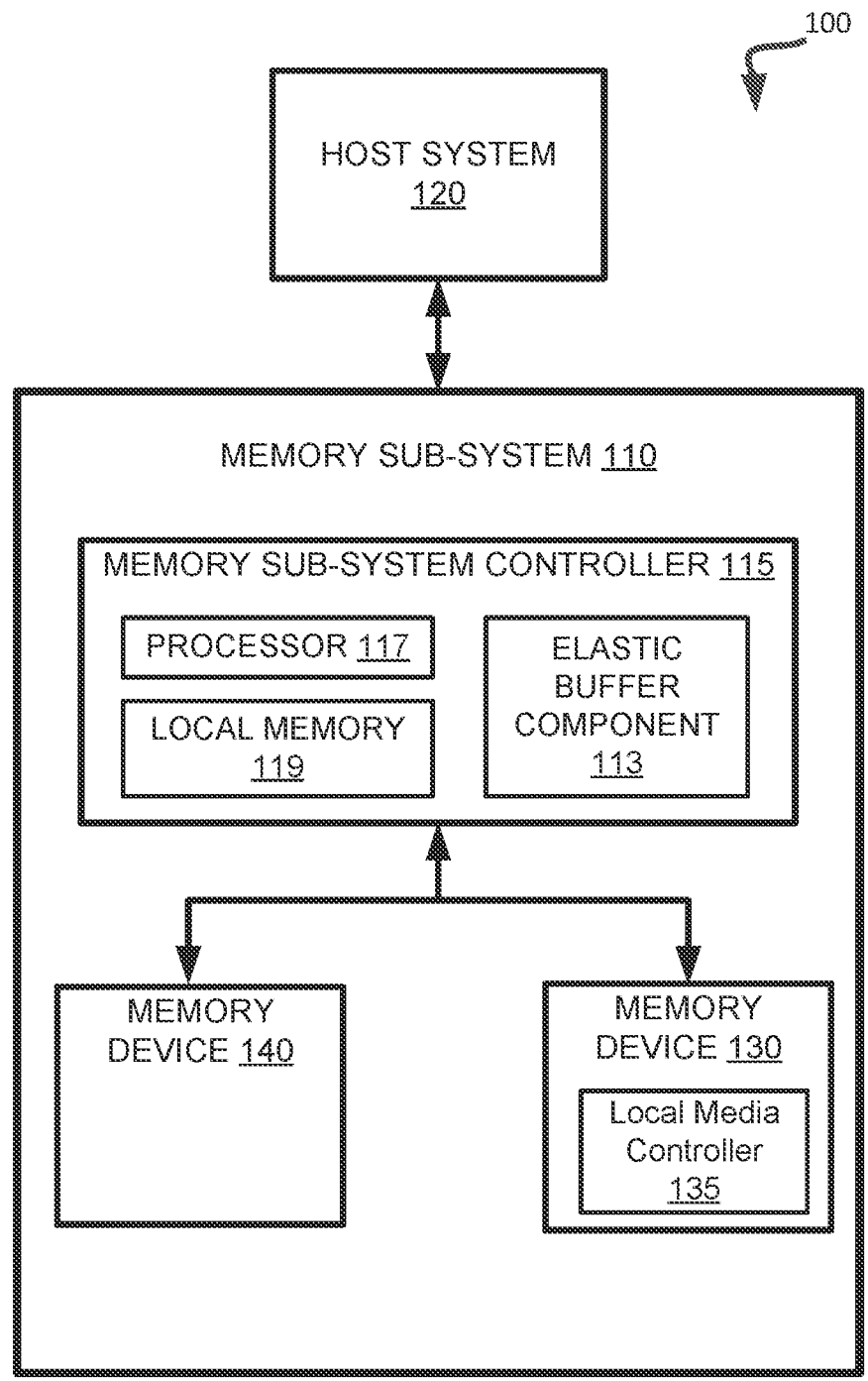
FIG. 1 illustrates an example computing system that includes a memory sub-system in accordance with some embodiments of the present disclosure.

Aspects of the present disclosure are directed to selectively sending event entries, including debugging information, from an elastic buffer in a memory sub-system to an associated host system over a communication pipe having limited bandwidth. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Debugging is a methodical process of finding and reducing the number of defects (i.e., "bugs") in an electronic device, such as a memory sub-system. Various debug techniques can be used to detect anomalies, assess their impact, and schedule hardware changes, firmware upgrades or full updates to a system. The goals of debugging include identifying and fixing bugs in the system (e.g., logical or synchronization problems in the firmware, or a design error in the hardware) and collecting system state information, such as information about the operation of the memory sub-system, that may then be used to analyze the memory sub-system to find ways to boost its performance or to optimize other important characteristics. One example of system state information can include event data generated in the memory sub-system. An event, as used herein, generally refers to a detectable action performed by hardware, software, firmware, or a combination of any of the above in the memory sub-system. Some examples of an event include a memory sub-system controller sending and/or receiving data or accessing a memory location of a memory device, a warning related to some reliability statistic (e.g., raw bit error rate (RBER)) of a memory device, an error experienced by the memory sub-system controller in reading data from or writing data to a memory device, etc.

In one implementation, a corresponding event entry can be generated and logged in response to the occurrence of each event. Since the range of actions that constitute an event is so broad, the size of the corresponding event entries can also vary greatly. For example, some events can have corresponding event entries that are relatively large in size, while other events can have corresponding event entries that are much smaller. Furthermore, the number and criticality of event entries corresponding to different types of events can also vary. Some events can occur with great frequency, but might be relatively unimportant, while other events occur very infrequently, but are very important. For example, hardware transactions occurring at an interval of one or several microseconds will have over 1000 occurrences before any event is recorded at a millisecond resolution. For this type of hardware transaction, logging every separate occurrence may not be critical given the extremely high number of repeated event entries.

In many conventional systems, debugging operations or other analyses of the memory sub-system are performed on a separate computing device, such as a host computing system, communicably coupled to the memory sub-system through a communication pipe. The communication pipe can be implemented using any one of various technologies, and can include, for example, a universal asynchronous receiver-transmitter (UART) bus, an inter-integrated circuit (I2C) bus, a system management bus (SMBus), a Nexus bus, a peripheral component interconnect express (PCIe) bus, or some other type of communication mechanism. Depending on the type of communication pipe used, the available bandwidth can vary, and only a fixed amount of system state information can be transferred over the communication pipe to the host system in a given amount of time. Thus, certain communication pipes can be considered to have limited bandwidth since they may not be able to adequately transfer all of the event entries generated in the memory sub-system. For example, a communication pipe having limited bandwidth may have a bandwidth that is below a certain threshold, or that is below a bandwidth level required to transfer a certain amount of data (e.g., the total size of all available event entries in the memory sub-system) within a fixed amount of time. When conventional systems attempt to transfer all of the event entries to the host system for debugging, certain event entries are dropped or delayed, potentially including critical or important event entries. In addition, other traffic in the communication pipe, such as host commands or memory sub-system data, can be delayed or dropped in favor of the system state information being transferred.

Aspects of the present disclosure address the above and other deficiencies by selectively sending event entries from an elastic buffer in a memory sub-system to an associated host system over a communication pipe having limited bandwidth. In one embodiment, in response to receiving a request for system state information from the host system or in response to the occurrence of a periodic interval, the memory subsystem can determine to send the system state information to the host system. As described herein, a number of event entries corresponding to events associated with the memory sub-system can be stored in a staging buffer. Each event entry can have one or more associated metadata tags that indicate, for example, a severity of the event entry, a priority level of the event entry, an amount of bandwidth required to transmit the event entry to the host system, and/or other information. In one embodiment, the memory sub-system can identify a subset of the event entries from the staging buffer based on one or more filtering factors. For example, the memory sub-system can compare the filtering factors to the metadata tags identify those entries having corresponding metadata tags that match the one or more filtering factors. These filtering factors can include, for example, an indication of a requested priority level, a privilege level of the host system, an amount of bandwidth available in the communication pipe, and/or other factors. Upon identifying an appropriate subset of the event entries in the staging buffer, rather than sending the entire contents of the staging buffer, the memory sub-system can selectively send the subset of event entries as the system state information to the host system over a communication pipe, such as a communication pipe having limited bandwidth. The filtering factors can be designed to result in a subset of event entries having a size compatible with the bandwidth of the communication pipe. Thus, the staging buffer can be considered to be "elastic" since the effective size is dynamically changed through the selection of the subset of event entries. Those remaining event entries not selected as part of the subset can remain in the staging buffer or be discarded, depending on the implementation.

By reducing the size of system state information transferred to the host system for the identified subset of event entries, the memory sub-system avoids overwhelming the communication pipe having limited bandwidth between the memory sub-system and the host system. Accordingly, event entries corresponding to events in the memory sub-system are not dropped or delayed, ensuring that critical event entries are received at the host system in a timely manner. Debugging operations and other analysis of the memory sub-system are thereby improved, allowing for adjustments to be made to improve performance of the memory sub-system. Thus, the resulting output is highly effective in depicting a proper flow of event information based on the bandwidth of the communication pipe. Furthermore, the limited bandwidth of the communication pipe is preserved allowing other traffic, including host system commands, memory sub-system data, etc. to be transferred without unnecessary delay.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes elastic buffer component 113 that can selectively send event entries from an elastic buffer in memory sub-system 110 to host system 110 over a communication pipe having limited bandwidth. In one embodiment, in response to receiving a request for system state information from host system 120 or in response to the occurrence of a periodic interval, elastic buffer component 113 can determine to send the system state information to host system 120. In one embodiment, the elastic buffer can be implemented in local memory 119 or in one of memory devices 130 or 140, and can store a number of event entries corresponding to events associated with memory sub-system 110. Each event entry can have one or more associated metadata tags that indicate, for example, a severity of the event entry, a priority level of the event entry, an amount of bandwidth required to transmit the event entry to the host system, and/or other information. In one embodiment, elastic buffer component 113 can identify a subset of the event entries from the staging buffer based on one or more filtering factors. For example, elastic buffer component 113 can compare the filtering factors to the metadata tags identify those entries for which the corresponding metadata tags match the one or more filtering factors. These filtering factors can include, for example, an indication of a requested priority level, a privilege level of the host system, an amount of bandwidth available in the communication pipe, and/or other factors. Upon identifying an appropriate subset of the event entries in the buffer, rather than sending the entire contents of the buffer, elastic buffer component 113 can selectively send the subset of event entries as the system state information to host system 120 over the communication pipe. The filtering factors can be designed to result in a subset of event entries having a size compatible with the bandwidth of the communication pipe. Elastic buffer component 113 can maintain those remaining event entries not selected as part of the subset in the elastic buffer or can discard those remaining event entries, depending on the implementation. Further details with regards to the operations of the elastic buffer component 113 are described below.

Figure 2:
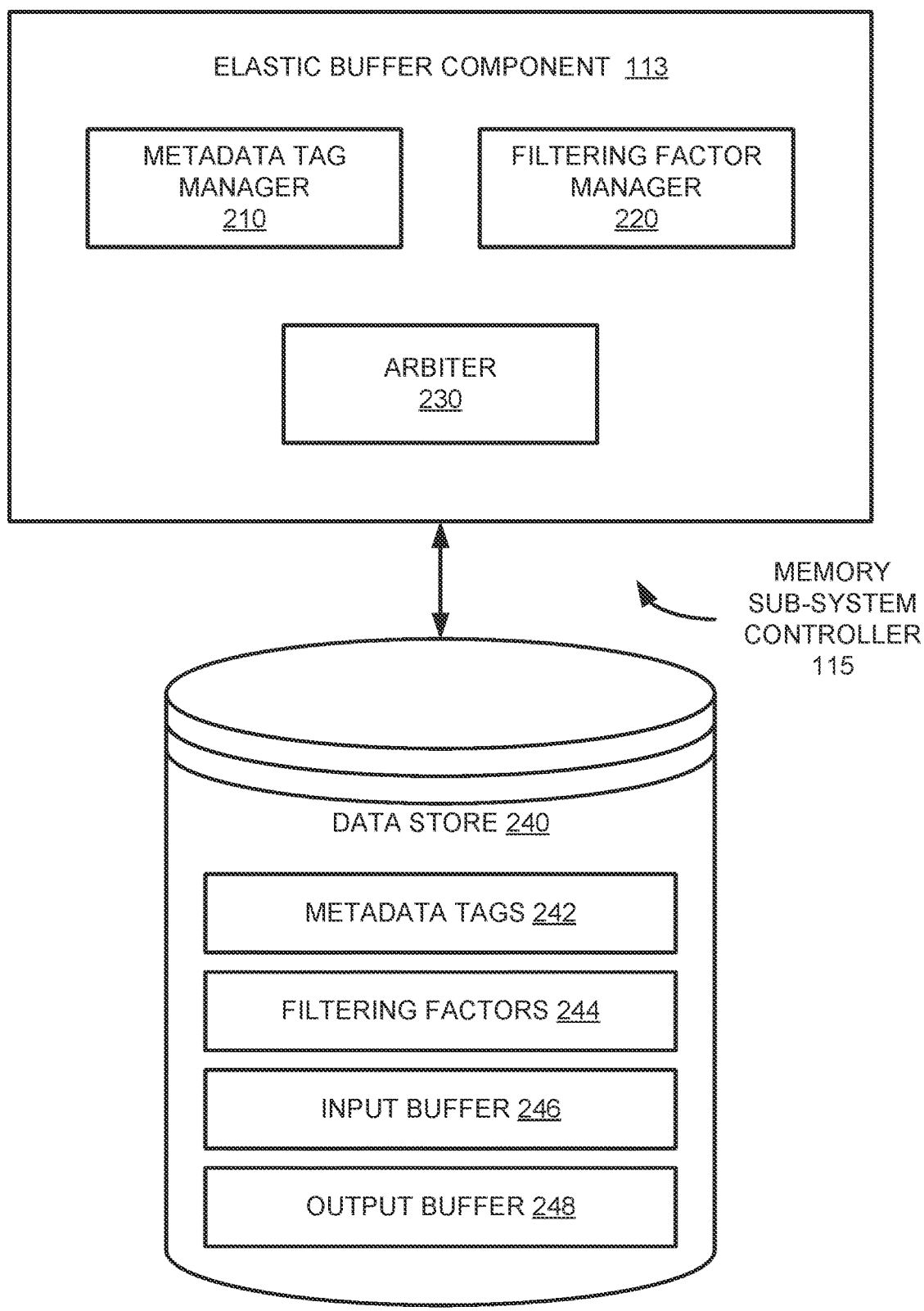
FIG. 2 is a block diagram illustrating an elastic buffer component in accordance with some embodiments of the present disclosure.

FIG. 2 is a block diagram illustrating an elastic buffer component in accordance with some embodiments of the present disclosure. In one embodiment, elastic buffer component 113 includes metadata tag manager 210, filtering factor manager 220, and arbiter 230. This arrangement of modules and components can be a logical separation, and in other embodiments, these modules or other components can be combined together or separated in further components, according to a particular implementation. In one embodiment, data store 240 is connected to elastic buffer component 113 and metadata tags 242, filtering factors 244, staging buffer 246, output buffer 248. In one implementation, one physical node (e.g., memory sub-system 110) can include both elastic buffer component 113 and data store 240. In another embodiment, data store 240 can be external to the physical node and can be connected over a network or other connection. In other implementations, the physical node and elastic buffer component 113 can include different and/or additional components and applications which are not shown to simplify the description. Data store 240 can be embodied on one or more mass storage devices which can include, for example, flash memory, magnetic or optical disks, or tape drives; read-only memory (ROM); random-access memory (RAM); erasable programmable memory (e.g., EPROM and EEPROM); flash memory; or any other type of storage medium. For example, data store 240 can be one representation of local memory 119, or can be part of memory device 130 or memory device 140, as illustrated in FIG. 1.

In one embodiment, metadata tag manager 210 controls the assignment of metadata tags 242 to event entries. Either upon creation of the event entries and prior to storing those event entries in staging buffer 246, or upon storing the event entries in staging buffer 246, metadata tag manager 210 can assign one or more of metadata tags 242 to each event entry. The metadata tags 242 define a context of the corresponding event entry and can ultimately be used in determining whether the corresponding event entry should be included in the subset of event entries sent to host system 120 as system state information. For example, the metadata tags 242 can include an indication of a severity of the corresponding event entry, a priority level of the corresponding event entry, an amount of bandwidth required to transmit the corresponding event entry to the host system 120, or other information. The severity of an event entry can include, for example, whether the event entry is merely informative, includes a warning, is indicative of an error having occurred in memory sub-system 110, or is debugging information. The priority level of an event entry can include any number of predefined levels, such as low, medium, high, etc. Certain events can be automatically assigned a certain priority level, or the priority level of an event can be dynamically determined by consideration of a number of factors. The amount of bandwidth required to transmit an event entry can be tied to a size of the event entry, with larger event entries requiring a higher amount of bandwidth. The amount of bandwidth can also be expressed as any number of predefined levels, such as low medium high, ultra-high, etc.

In one embodiment, filtering factor manager 220 controls the updating and management of filtering factors 244, based on memory sub-system configuration and on feedback received from host system 120. In one embodiment, the filtering factors 244 are defined based on the type of communication pipe between memory sub-system 110 and host system 120, the configuration of host system 120 making the request for system state information, and optionally on specific feedback provided by host system 120 after receiving prior system state information. For example, the filtering factors 244 can include an indication of a requested priority level, a privilege level of the host system 120, an amount of bandwidth available in the communication pipe, or other factors. The requested priority level of system state information can be specified by host system 120, or can be used by arbiter 230 as a weighting factor when selecting a subset of event entries. For example, the host system 120 can request that only high priority event entries be transferred, or that low priority event entries not be transferred. In addition, arbiter 230 can prioritize high priority event entries over medium and low priority event entries. The privilege level of the host system 120 can be any of a number of discrete levels, such as, P0, P1, P2, . . . Pn. Each host system can be assigned a corresponding privilege level which dictates the type of event entries which the host system is entitled to receive. For example, a host with privilege level P0 can be entitled to receive all possible types of event entries, while a host with privilege level P1 can be entitled to receive only event entries classified as warnings or errors. The amount of bandwidth available in the communication pipe can be tied to the type of communication pipe used. For example, a UART bus, an I2C bus, an SMBus, a Nexus bus, and a PCIe bus, all have different amounts of bandwidth. The amount of bandwidth can also be expressed as any number of predefined levels, such as low medium high, ultra-high, etc.

In one embodiment, arbiter 230 identifies a subset of event entries having associated metadata tags 242 from staging buffer 246 based on one or more of filtering factors 244. For example, arbiter 230 can compare the filtering factors 244 to the metadata tags 242 associated with each of the event entries and identify those for which the corresponding metadata tags match the filtering factors 244. Thus, in one embodiment, the subset includes less than all of the event entries available in staging buffer 246. In another embodiment, the subset includes all of the event entries in staging buffer 246, so long as all of those event entries satisfy the filtering factors 244. In one embodiment, arbiter 230 identifies the subset of event entries and sends them directly to host system 120 from staging buffer 246 via the communication pipe. In another embodiment, arbiter 230 copies the subset of event entries from staging buffer 246 to output buffer 248, and the contents of output buffer 248 is transferred to host system 120 via the communication pipe. Arbiter 230 can maintain those remaining event entries not selected as part of the subset in staging buffer 246 or can discard those remaining event entries, depending on the implementation.

Figure 3:
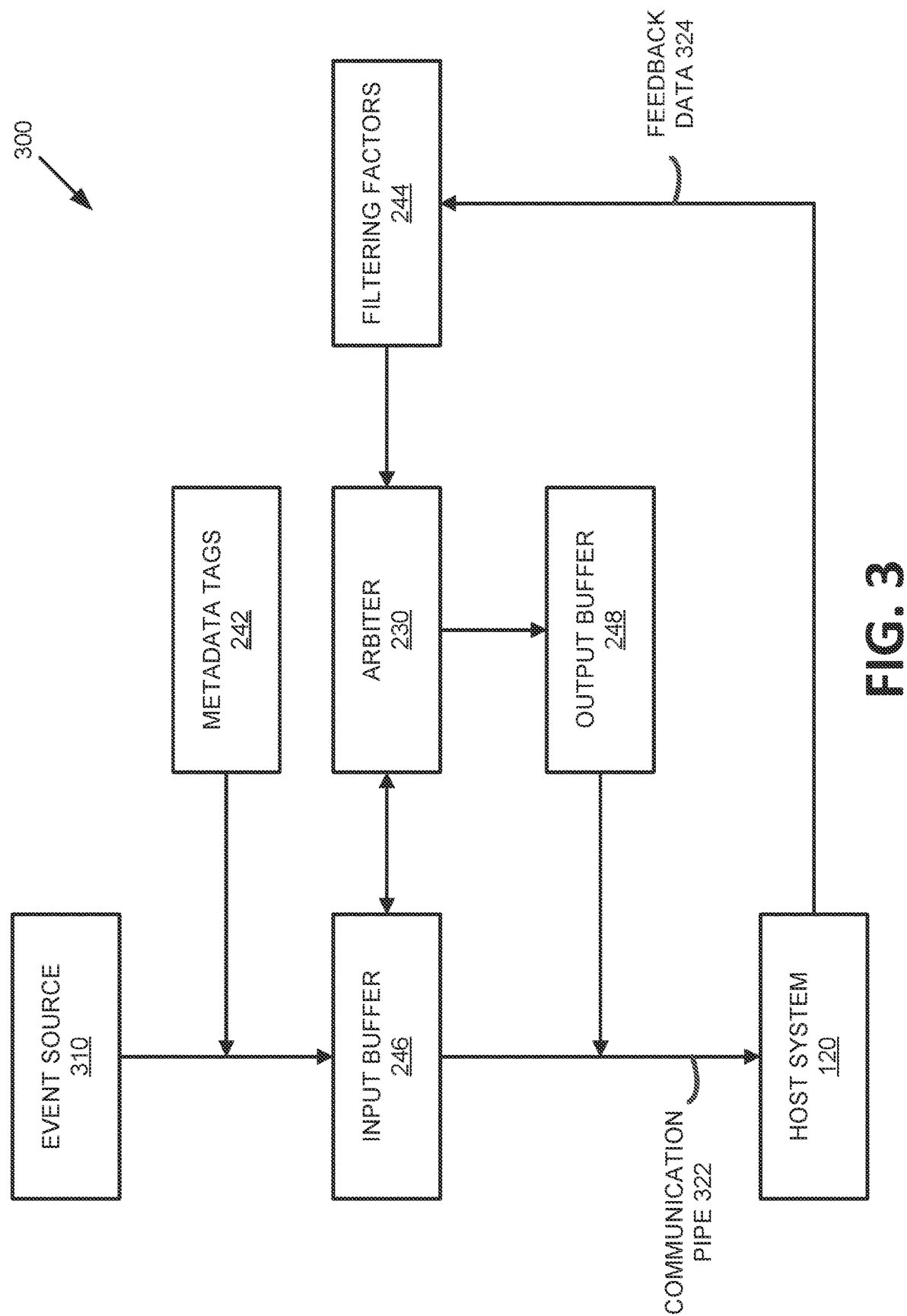
FIG. 3 is a block diagram illustrating operation of an elastic buffer for debugging information sent from a memory device to a host system in accordance with some embodiments of the present disclosure.

FIG. 3 is a block diagram illustrating operation of an elastic buffer for debugging information sent from a memory device to a host system in accordance with some embodiments of the present disclosure. Depending on the embodiment, the elastic buffer can include either staging buffer 246 or the combination of staging buffer and output buffer 248. As described herein, one or more filtering factors are used to select a subset of event entries from staging buffer 246 having a size compatible with the bandwidth of the communication pipe 322 between memory sub-system 110 and host system 120. The subset of event entries can be transferred directly from staging buffer 246 to host system 120 or first moved to an output buffer 248 and then transferred to host system 120. Since less than the entire contents of staging buffer 246 are transferred, however, the staging buffer 246 can be considered to be "elastic" as the effective size is dynamically changed through the selection of the subset of event entries. Those remaining event entries not selected as part of the subset can remain in the staging buffer 246 or be discarded, depending on the implementation.

In one embodiment, new event entries are received from event source 310. Event source 310 can be any component within memory sub-system 110, such as memory sub-system controller 115, memory device 130, memory device 140, or some other component. Each event entry can correspond to an event having occurred in memory sub-system 110. Each event refers to a detectable action performed by hardware, software, firmware, or a combination of any of the above in memory sub-system 110. Some examples of an event include memory sub-system controller 115 sending and/or receiving data or accessing a memory location of a memory device 130, a warning related to some reliability statistic (e.g., raw bit error rate (RBER)) of a memory device 130, an error experienced by the memory sub-system controller 115 in reading data from or writing data to a memory device 130, etc. Since the range of actions that constitute an event is so broad, the size of the corresponding event entries can also vary greatly. For example, some events can have corresponding event entries that are relatively large in size, while other events can have corresponding event entries that are much smaller. Furthermore, the number and criticality of event entries corresponding to different types of can also vary. Some events can occur with great frequency, but might be relatively unimportant, while other events occur very infrequently, but are very important.

In one embodiment, metadata tag manager 210 can assign one or more of metadata tags 242 to each event entry prior to or upon storage of the event entry in staging buffer 246. The metadata tags 242 define a context of the corresponding event entry and can ultimately be used in determining whether the corresponding event entry should be included in the subset of event entries sent to host system 120 as system state information. For example, the metadata tags 242 can include an indication of a severity of the corresponding event entry, a priority level of the corresponding event entry, an amount of bandwidth required to transmit the corresponding event entry to the host system 120, or other information.

In one embodiment, arbiter 230 identifies a subset of event entries having associated metadata tags 242 from staging buffer 246 based on one or more of filtering factors 244. For example, arbiter 230 can compare the filtering factors 244 to the metadata tags 242 associated with each of the event entries and identify those for which the corresponding metadata tags match the filtering factors 244. For example, the filtering factors 244 can include an indication of a requested priority level, a privilege level of the host system 120, an amount of bandwidth available in the communication pipe, or other factors. In one embodiment, arbiter 230 identifies the subset of event entries and sends them directly to host system 120 from staging buffer 246 via communication pipe 322. In another embodiment, arbiter 230 copies the subset of event entries from staging buffer 246 to output buffer 248, and the contents of output buffer 248 is transferred to host system 120 via the communication pipe 322. Arbiter 230 can maintain those remaining event entries not selected as part of the subset in staging buffer 246 or can discard those remaining event entries, depending on the implementation.

In one embodiment, filtering factor manager 220 controls the updating and management of filtering factors 244, based on feedback data 324 received from host system 120. In one embodiment, the filtering factors 244 are defined based on the type of communication pipe between memory sub-system 110 and host system 120, the configuration of host system 120 making the request for system state information, and optionally on specific feedback data 324 provided by host system 120 after receiving prior system state information. For example, the feedback data 324 can include a change to the requested priority level of event entries desired by host system 120, a change in the privilege level of host system 120, a change in the bandwidth available in communication pipe 322 coupled to host system 120, or other information that can impact the filtering factors 244.

Figure 4:
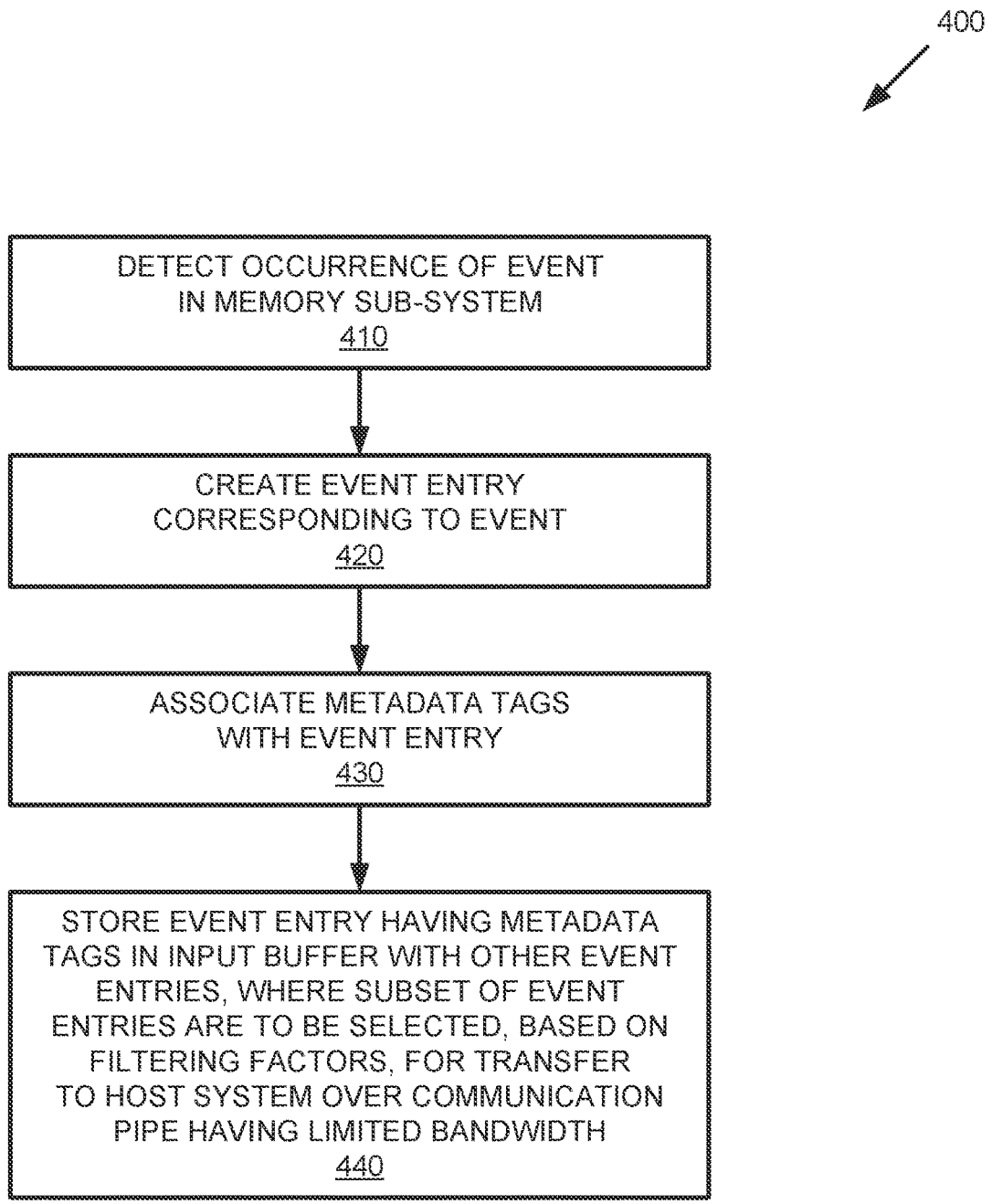
FIG. 4 is a flow diagram of an example method of associating metadata tags with event entries in accordance with some embodiments of the present disclosure.

FIG. 4 is a flow diagram of an example method of associating metadata tags with event entries in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by elastic buffer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic detects occurrence of an event in memory sub-system 110. Each event refers to a detectable action performed by hardware, software, firmware, or a combination of any of the above in memory sub-system 110. Some examples of an event include memory sub-system controller 115 sending and/or receiving data or accessing a memory location of a memory device 130, a warning related to some reliability statistic (e.g., raw bit error rate (RBER)) of a memory device 130, an error experienced by the memory sub-system controller 115 in reading data from or writing data to a memory device 130, etc. In one embodiment, elastic buffer component 113 detects the occurrence of the event. In another embodiment, some other monitoring component in memory sub-system 110 detects the occurrence of the event.

At operation 420, the processing logic creates an event entry corresponding to the detected event. In response to detection of the occurrence of the event, either elastic buffer component 113 or some other component in memory sub-system 110 can create the corresponding event entry. The event entry marks the occurrence of the event by storing details associated with the event, such as what action served as the event, which components of memory sub-system 110 were involved in the event, when the event occurred, etc.

At operation 430, the processing logic associates one or more metadata tags with the event entry. In one embodiment, metadata tag manager 210 can assign one or more of metadata tags 242 to the event entry. The metadata tags 242 define a context of the event entry and can ultimately be used in determining whether the event entry should be included in the subset of event entries sent to host system 120 as system state information. For example, the metadata tags 242 can include an indication of a severity of the event entry, a priority level of the event entry, an amount of bandwidth required to transmit the event entry to the host system 120, or other information.

At operation 440, the processing logic stores the event entry having the associated metadata tags 242 in a staging buffer 246 with other event entries. In one embodiment, the staging buffer 246 includes all event entries generated in memory sub-system 110 since system state information was last sent to host system 120. In one embodiment, only a subset of the event entries in staging buffer 246 are to be selected, based on one or more filtering factors 244, for transfer to host system 120 over a communication pipe 322 having limited bandwidth. In one embodiment, arbiter 230 can compare the filtering factors 244 to the metadata tags 242 associated with each of the event entries and identify those for which the corresponding metadata tags match the filtering factors 244. For example, the filtering factors 244 can include an indication of a requested priority level, a privilege level of the host system 120, an amount of bandwidth available in the communication pipe, or other factors. Arbiter 230 can maintain those remaining event entries not selected as part of the subset in staging buffer 246 or can discard those remaining event entries, depending on the implementation.

Figure 5:
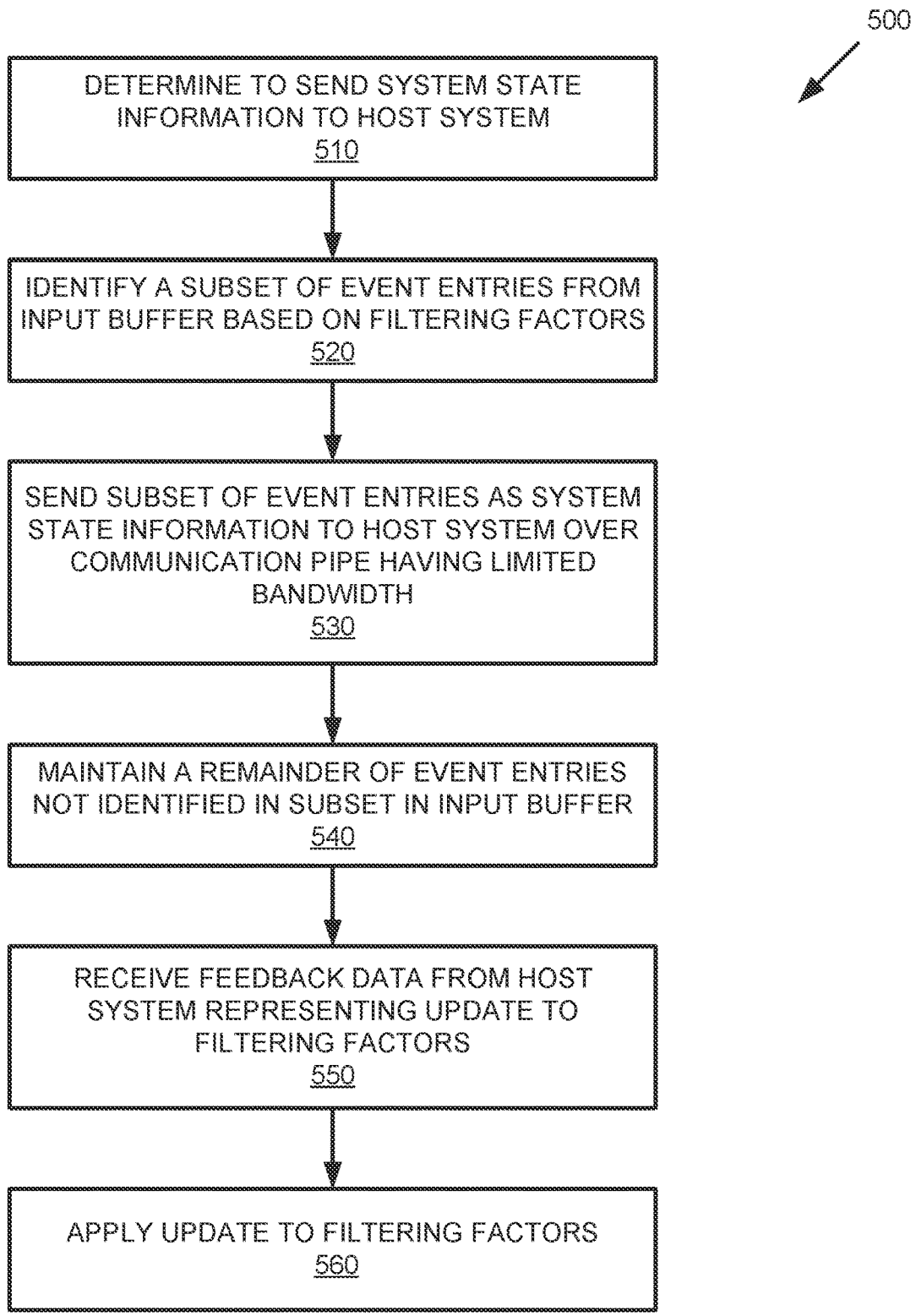
FIG. 5 is a flow diagram of an example method of selectively sending event entries from an elastic buffer to a host system in accordance with some embodiments of the present disclosure.

FIG. 5 is a flow diagram of an example method of selectively sending event entries in an elastic buffer to a host system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by elastic buffer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines to send system state information associated with memory sub-system 110 and/or memory device 130 to host system 120. In one embodiment, elastic buffer component 113 receives a request for the system state information from host system 120 and determines to send the system state information in response. In another embodiment, elastic buffer component 113 determines the occurrence of a periodic interval upon which the system state information is to be sent to host system 120. For example, elastic buffer component 133 can be configured to send the system state information to host system 120, every hour, every day, every week, etc.

At operation 520, the processing logic identifies a subset of event entries from staging buffer 246 based on one or more filtering factors 244. In one embodiment, arbiter 230 can compare the filtering factors 244 to metadata tags 242 associated with each of the event entries and identify those for which the corresponding metadata tags match the filtering factors 244. For example, the filtering factors 244 can include an indication of a requested priority level, a privilege level of the host system 120, an amount of bandwidth available in the communication pipe, or other factors.

At operation 530, the processing logic sends the subset of event entries as system state information to host system 120 over a communication pipe 322 having limited bandwidth. In one embodiment, arbiter 230 identifies the subset of event entries and sends them directly to host system 120 from staging buffer 246 via communication pipe 322. In another embodiment, arbiter 230 copies the subset of event entries from staging buffer 246 to output buffer 248, and the contents of output buffer 248 is transferred to host system 120 via the communication pipe 322. At operation 540, the processing logic maintains those remaining event entries not selected as part of the subset in staging buffer 246. In another embodiment, the processing logic can discard those remaining event entries not sent to host system 120.

At operation 550, the processing logic receives feedback data from host system 120 representing an update to the one or more filtering factors 244. In one embodiment, the filtering factors 244 are defined based on the type of communication pipe between memory sub-system 110 and host system 120, the configuration of host system 120 making the request for system state information, and optionally on specific feedback data 324 provided by host system 120 after receiving prior system state information. For example, the feedback data 324 can include a change to the requested priority level of event entries desired by host system 120, a change in the privilege level of host system 120, a change in the bandwidth available in communication pipe 322 coupled to host system 120, or other information that can impact the filtering factors 244. At operation 560, the processing logic applies the update to the filtering factors 560 so that the updated filtering factors can be used by arbiter 230 in the future when identifying subsequent subsets of event entries to send to host system 120.

Figure 6:
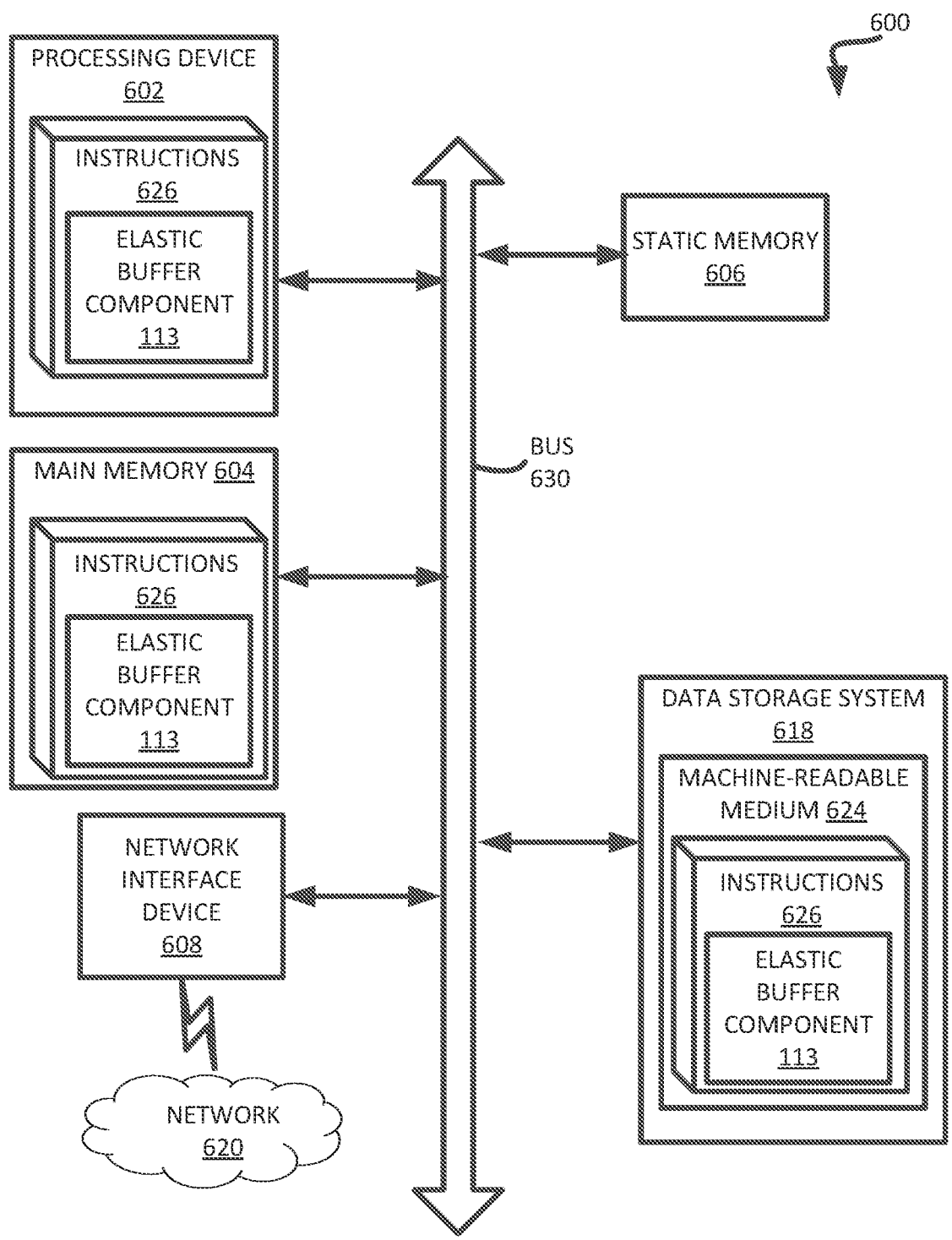
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the elastic buffer component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the elastic buffer component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
identifying a subset of a plurality of event entries from a staging buffer based on one or more filtering factors, wherein the one or more filtering factors are defined based at least in part on a priority level of the event entries and on an amount of bandwidth available in a communication pipe between the system and a host system, and wherein the plurality of event entries corresponds to events associated with the memory device; and
sending the subset of the plurality of event entries to the host system over the communication pipe.

2. The system of claim 1, wherein the processing device is to perform operations further comprising:
determining to send system state information associated with the memory device to the host system, wherein determining to send system state information comprises at least one of:
receiving a request for the system state information from the host system;
or
determining an occurrence of a periodic interval upon which the system state information is to be sent to the host system.

3. The system of claim 1, wherein identifying the subset of the plurality of event entries comprises comparing the one or more filtering factors to one or more metadata tags associated with each of the plurality of event entries.

4. The system of claim 3, wherein the subset of the plurality of event entries comprises event entries for which the corresponding one or more metadata tags match the one or more filtering factors.

5. The system of claim 3, wherein the one or more metadata tags comprise one or more of an indication of a severity of a corresponding event entry, a priority level of the corresponding event entry, or an amount of bandwidth required to transmit the corresponding event entry to the host system.

6. The system of claim 1, wherein sending the subset of the plurality of event entries to the host system comprises at least one of:
moving the subset of the plurality of event entries from the staging buffer to an output buffer and transmitting contents of the output buffer to the host system; or
selecting the subset of the plurality of event entries from the staging buffer and sending the selected subset of the plurality of entries from the staging buffer to the host system.

7. The system of claim 1, wherein the communication pipe at least one of a universal asynchronous receiver-transmitter (UART) bus, an inter-integrated circuit (I2C) bus, a system management bus (SMBus), a Nexus bus, or a peripheral component interconnect express (PCIe) bus.

8. The system of claim 1, wherein the processing device is to perform operations further comprising:
maintaining a remainder of the plurality of entries not identified in the subset in the staging buffer.

9. The system of claim 1, wherein the processing device is to perform operations further comprising:
receiving, from the host system, feedback data representing an update to the one or more filtering factors; and
applying the feedback data to the one or more filtering factors.

10. A method comprising:
identifying a subset of a plurality of event entries from a staging buffer based on one or more filtering factors, wherein the one or more filtering factors are defined based at least in part on a priority level of the event entries and on an amount of bandwidth available in a communication pipe between the system and a host system, and wherein the plurality of event entries corresponds to events associated with the memory device; and
sending the subset of the plurality of event entries to the host system over the communication pipe.

11. The method of claim 10, wherein the processing device is to perform operations further comprising:
determining to send system state information associated with the memory device to the host system, wherein determining to send system state information comprises at least one of:
receiving a request for the system state information from the host system;
or
determining an occurrence of a periodic interval upon which the system state information is to be sent to the host system.

12. The method of claim 10, wherein identifying the subset of the plurality of event entries comprises comparing the one or more filtering factors to one or more metadata tags associated with each of the plurality of event entries, wherein the subset of the plurality of event entries comprises event entries for which the corresponding one or more metadata tags match the one or more filtering factors, wherein a remainder of the plurality of entries not identified in the subset are maintained in the staging buffer, and wherein the one or more metadata tags comprise one or more of an indication of a severity of a corresponding event entry, a priority level of the corresponding event entry, or an amount of bandwidth required to transmit the corresponding event entry to the host system.

13. The method of claim 10, wherein sending the subset of the plurality of event entries to the host system comprises at least one of:
moving the subset of the plurality of event entries from the staging buffer to an output buffer and transmitting contents of the output buffer to the host system; or
selecting the subset of the plurality of event entries from the staging buffer and sending the selected subset of the plurality of entries from the staging buffer to the host system.

14. The method of claim 10, wherein the processing device is to perform operations further comprising:
receiving, from the host system, feedback data representing an update to the one or more filtering factors; and applying the feedback data to the one or more filtering factors.

15. A non-transitory computer-readable storage medium comprising instructions that, when executed by a processing device, cause the processing device to perform operations comprising:
    identifying a subset of a plurality of event entries from a staging buffer based on one or more filtering factors, wherein the one or more filtering factors are defined based at least in part on a priority level of the event entries and on an amount of bandwidth available in a communication pipe between the system and a host system, and wherein the plurality of event entries corresponds to events associated with a memory device; and
    send the subset of the plurality of event entries to the host system over the communication pipe.

16. The non-transitory computer-readable storage medium of claim 15, wherein the instructions cause the processing device to perform operations further comprising:
    determining to send system state information to the host system, wherein determining to send the system state information comprises at least one of:
        receiving a request for the system state information from the host system;
    or
        determining an occurrence of a periodic interval upon which the system state information is to be sent to the host system.

17. The non-transitory computer-readable storage medium of claim 15, wherein identifying the subset of the plurality of event entries comprises comparing the one or more filtering factors to one or more metadata tags associated with each of the plurality of entries, wherein the subset of the plurality of event entries comprises event entries for which the corresponding one or more metadata tags match the one or more filtering factors, and wherein a remainder of the plurality of entries not identified in the subset are maintained in the staging buffer.

18. The non-transitory computer-readable storage medium of claim 17, wherein the one or more metadata tags comprise one or more of an indication of a severity of a corresponding event entry, a priority level of the corresponding event entry, or an amount of bandwidth required to transmit the corresponding event entry.

19. The non-transitory computer-readable storage medium of claim 15, wherein sending the subset of the plurality of event entries to the host system comprises at least one of:
    moving the subset of the plurality of event entries from the staging buffer to an output buffer and transmitting contents of the output buffer to the host system; or
    selecting the subset of the plurality of event entries from the staging buffer and sending the selected subset of the plurality of entries from the staging buffer to the host system.

20. The non-transitory computer-readable storage medium of claim 15, wherein the instructions cause the processing device to performing operations further comprising:
    receiving, from the host system, feedback data representing an update to the one or more filtering factors; and
    applying the feedback data to the one or more filtering factors.

* * * * *